(12) United States Patent
Harrison

(10) Patent No.: US 6,452,494 B1
(45) Date of Patent: Sep. 17, 2002

(54) ACTIVATING DEVICES

(75) Inventor: Edward R. Harrison, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/405,588

(22) Filed: Sep. 27, 1999

(51) Int. Cl.[7] .............................................. G08B 13/08
(52) U.S. Cl. ..................... 340/545.4; 340/562; 340/654
(58) Field of Search .......................... 340/568.7, 568.1, 340/545.5, 540, 669, 670, 870.37, 561, 562, 545.4, 654, 653, 635; 320/127; 710/18; 307/112, 116, 125, 139; 341/33; 200/600

(56) References Cited

U.S. PATENT DOCUMENTS

| | | | | |
|---|---|---|---|---|
| 4,413,252 A | * | 11/1983 | Tyler et al. | 341/33 |
| 4,595,913 A | * | 6/1986 | Aubuchon | 341/33 |
| 4,736,191 A | * | 4/1988 | Matzke et al. | 341/33 |
| 5,329,577 A | * | 7/1994 | Norimatsu | 379/58 |
| 5,508,700 A | * | 4/1996 | Taylor et al. | 341/33 |
| 5,543,588 A | * | 8/1996 | Bisset et al. | 178/18 |
| 5,796,183 A | * | 8/1998 | Hourmand | 307/116 |
| 5,844,204 A | * | 12/1998 | Cubizolles et al. | 219/257 |
| 5,861,875 A | * | 1/1999 | Gerpheide | 345/174 |
| 5,880,718 A | * | 3/1999 | Frindle et al. | 345/174 |
| 5,933,102 A | * | 8/1999 | Miller et al. | 341/33 |
| 5,991,827 A | * | 11/1999 | Ellenby et al. | 710/8 |
| 6,002,946 A | * | 12/1999 | Reber et al. | 455/557 |
| 6,037,748 A | * | 3/2000 | Yee et al. | 320/127 |
| 6,075,356 A | * | 6/2000 | Kovacs | 323/327 |
| 6,098,118 A | * | 8/2000 | Ellenby et al. | 710/8 |

* cited by examiner

Primary Examiner—Jeffery Hofsass
Assistant Examiner—Toan Pham
(74) Attorney, Agent, or Firm—Fish & Richardson P.C.

(57) ABSTRACT

A method for operating an electronic device. The method includes receiving an electrical signal from a sensor attached to the device and determining whether the device is being handled by a user based on the signal. The method includes switching the device from an inactive state to an active state in response to determining that the device is being handled.

7 Claims, 2 Drawing Sheets

ACTIVATING DEVICES

BACKGROUND OF THE INVENTION

This invention relates to activating devices.

A set of batteries can power a portable consumer device longer if the device is only turned on during periods of actual use. For example, one set of batteries can operate a television remote control for several months. The controller turns on each time that one of its function buttons is pressed and turns off after performing the function for the pressed button.

SUMMARY OF THE INVENTION

In a first aspect, the invention provides a method for operating an electronic device. The method includes receiving an electrical signal from a sensor attached to the device and determining whether the device is being handled by a user based on the signal. The method includes switching the device from an inactive state to an active state in response to determining that the device is being handled.

In a second aspect, the invention provides an apparatus that performs a function. The apparatus includes a function circuit to perform the function and a monitoring module to control the function circuit. The monitoring module activates the function circuit in response to determining that the device is being handled.

In a third aspect, the invention provides an apparatus having an electronic device and a monitoring module. The monitoring module is coupled to activate the device in response to determining that the device is being handled by a user.

Other features and advantages of the invention will be apparent from the following description and claims.

BRIEF DESCRIPTION OF THE DRAWINGS

According to various embodiments of the present invention.

DETAILED DESCRIPTION

Figure 1:
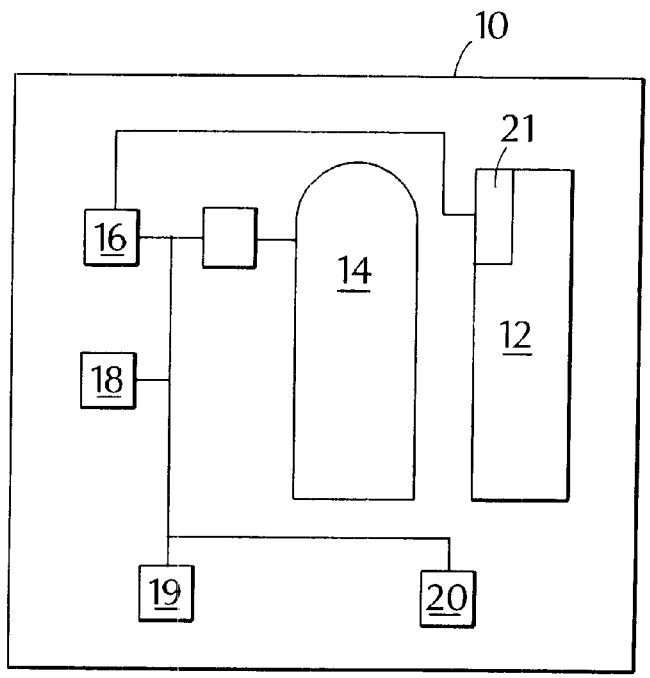
FIG. 1 shows a device that activates in response to being handled.

FIG. 1 is a block diagram of a portable device 10 that activates in response to being handled by a human user. Handling includes user acts like picking up, holding, carrying, or grabbing any part of the device 10. These acts "implicitly" show that the user wants to use the device 10. The device 10 activates without an "explicit" act directed at activating the device 10, e.g., pushing an "on" button 10 or touching a particular feature on the device 10.

The device 10 activates and is ready for use more rapidly than conventional devices, because the user does not look for and push an "on" button to activate the device. The user simply picks up or starts handling the device 10 as if he is going to use it, and the device 10 becomes active.

The device 10 has function circuits 12 for performing any of a variety of consumer-oriented functions. For example, the function circuits 12 could implement an Internet access device, a computer, audio or video component, e.g., a player or receiver, or a portable light.

The device 10 has an active state and a deactivated state. In the active state, a battery pack 14 powers the function circuits 12, a monitoring module 16, and sensors 18–20. The function circuits perform the primary functions of the device 10, e.g., data processing for a computer. The device 10 is ready to perform its intended functions in the active state. In the deactivated state, the battery pack 14 powers the monitoring module 16 and sensors 18–20. The monitoring module 16 and sensors 18–20 determine whether a user is handling the device 10.

In the active state, the function circuits 12 of the device 10 may not be performing any functions. Nevertheless, these circuits 12 are powered and thus, ready to perform functions. In the deactivated state, the function circuits 12 are not powered and are thus, not ready to perform functions.

The monitoring module 16 activates the device 10 by using a switch 21, e.g., a transistor, which is connected between the battery pack 14 and the function circuit 12. In the active state, the switch 21 is closed and enables current from the battery pack 14 to power the function circuit 12.

Generally, powering the function circuits 12 consumes more power than powering the monitoring module 16 and sensors 18–20. Thus, deactivating the function circuits 12, when not in use, saves substantial battery lifetime.

Figure 2:
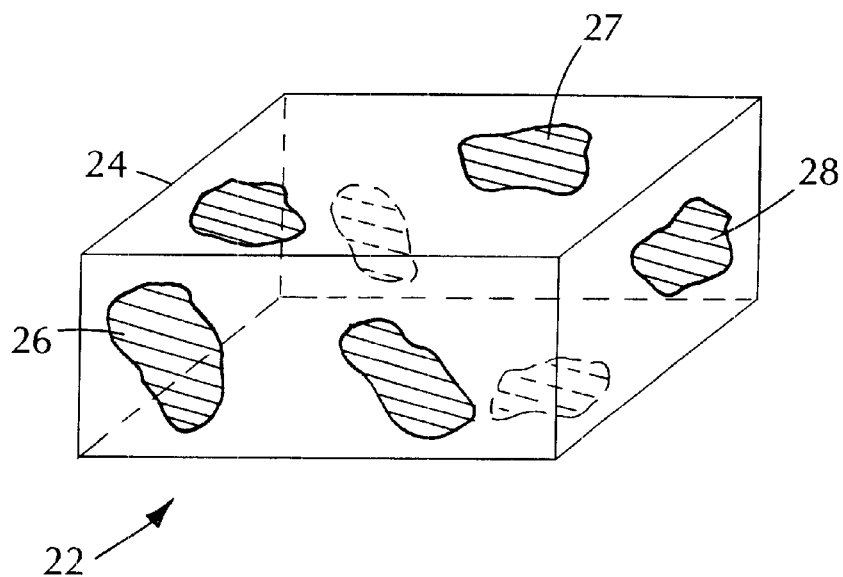
FIG. 2 is a perspective view of the device that activates in response to being handled.

FIG. 2 shows an embodiment 22 of the device 10 of FIG. 1 in which each sensor 18–20 includes one or more conductive paint spots 26–28 located on the outer surface of a case 24. There may be more or less sensors 18–20 and/or paint spots 26–28 in different embodiments. Each paint spot 26–28 covers a portion of the surface of the case 24 of the portable device 10. Together, the paint spots 26–28 cover enough of the case 24 so that a person grabbing, holding or picking up the device 10 will touch one of the spots 26–28. One conductive paint, which can be used to make the spots 26–28, is manufactured by Chemtronics at 8125 Cobb Center Drive, Kennesaw, Ga. 30152 USA. Other types of conductive paint may also be used for the spots 26–28. The paint spots 26–28 are capacitive elements that connect to the monitoring module 18.

The capacitances of the paint spots 26–28 change when touched by a human user. The monitoring module 18 measures such capacitance changes and can thereby determine whether a human user is touching one of the paint spots 26–28. Capacitance changes in the paint spots 26–28 can be measured from delays that such changes induce in propagating alternating current (AC) signals, e.g., square waves. This method is discussed in more detail in "Touch-Sensing Input Devices", by Ken Hinckley and Mike Sinclair, in Proceedings of the ACM CHI '99, Conference on Human Factors in Computing Systems (May 15–20, 1999), page 223–230. Other methods of detecting capacitance changes exist.

In other embodiments, the sensors 18–20 may detect user handling of the device 10 by a different method. For example, the sensors 18–20 may detect accelerations or motion. Acceleration sensors and motion sensors, e.g., gyroscopes are well known in the art. Again, such sensors detect implicit user handling, e.g., picking up, carrying, holding, or grabbing, and not only actions particularly directed at activating the device 10.

In various embodiments, sensor signals may respond to handling through different induced effects. The sensor signals may respond to the selected sensor 16–18 being touched by a user, e.g., through the capacitances of the spots 26–28. The sensor signals may also respond to the device 10 accelerating or moving as a result of the device 10 being picked up by a user, e.g., through accelerometeric or gyroscopic sensors.

Figure 3:
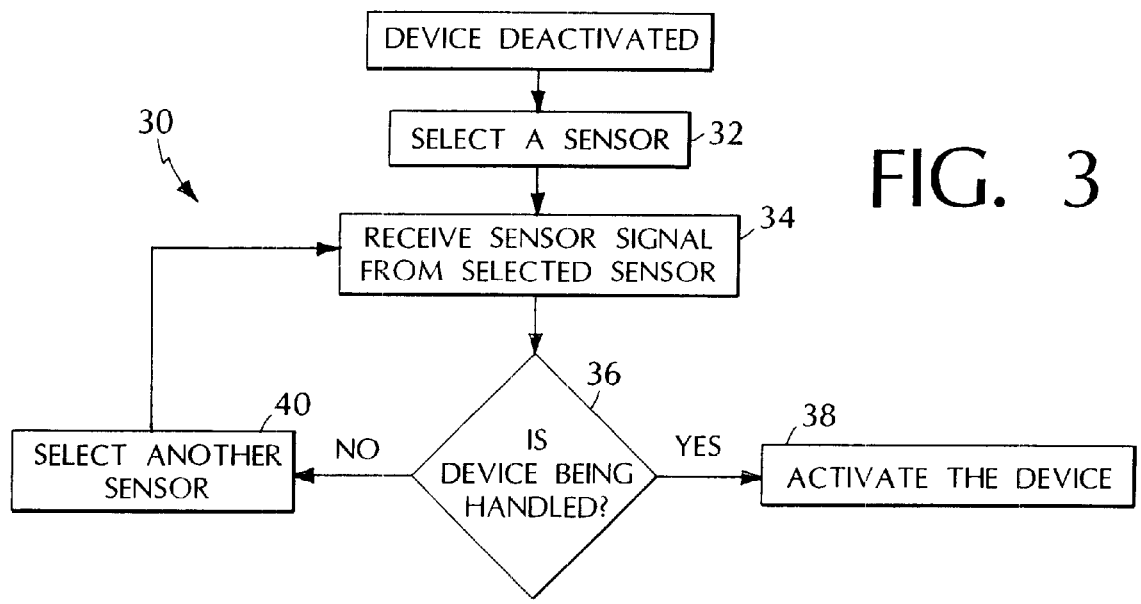
FIG. 3 is a flow chart for a method of activating a device.

FIG. 3 is a flow chart illustrating a method 30 of activating the portable device 10 of FIG. 1. The monitoring module 16 selects one of the sensors 18–20 (step 32). The sensors 18–20 continuously produce electrical signals responsive to user handling of the device 10.

In response to selecting one of the sensors 18–20, the monitoring module 16 receives the electrical signal produced by the selected sensor 18–20 (step 34). From the received sensor signal, the monitoring module 16 determines whether the portable device 10 is being handled, e.g., grabbed, picked up, or carried, by a human user (step 36). To determine whether the device 10 is being handled, the monitoring module 16 performs processing adapted to the form of the selected sensor 16–18. For example, for the conductive paint spots 26–28, the monitoring module 16 determines whether the value of the capacitance of the selected spot 26–28 has a value for a conductive paint spot touched by a human.

If the monitoring module 16 determines that the device 10 is being handled, the monitoring module 16 activates the device 10 (step 38). The device 10 is activated by supplying power to the function circuits 12 from the battery pack 14.

Powering the function circuits 16 may result in automatic actions by the device 10. For example, one embodiment of the device 10 is a television remote control. When the function circuits 16 for the remote control are powered, they automatically signal the television to turn on.

If the monitoring module 16 determines that the device 10 is not being handled, the monitoring module 16 selects another one of the sensors 18–20 (step 40). Then, the monitoring module 16 performs the same steps 34, 36, 38, 40 for the newly selected sensor 18–20. As long as the device 10 is not activated, the monitoring module 16 continues to select new ones of the sensors 18–20, in round robin fashion, and to perform steps 34 to 40. When the monitoring module 16 has checked the signal from each sensor 18–20, the monitoring module 16 reselects the first sensor 18–20 and performs steps 34, 36, 38, and 40 for that sensor.

The monitoring module 16 continually checks whether the device 10 is being handled. The continual checking for handling produces a very low drain on the battery pack 14, because the monitoring module 16 and sensors 18–20 are low power apparatus. For periods of storage, the device 10 also has a manual switch 42 for cutting power to the monitoring module 16 and sensors 18–20.

Figure 4:
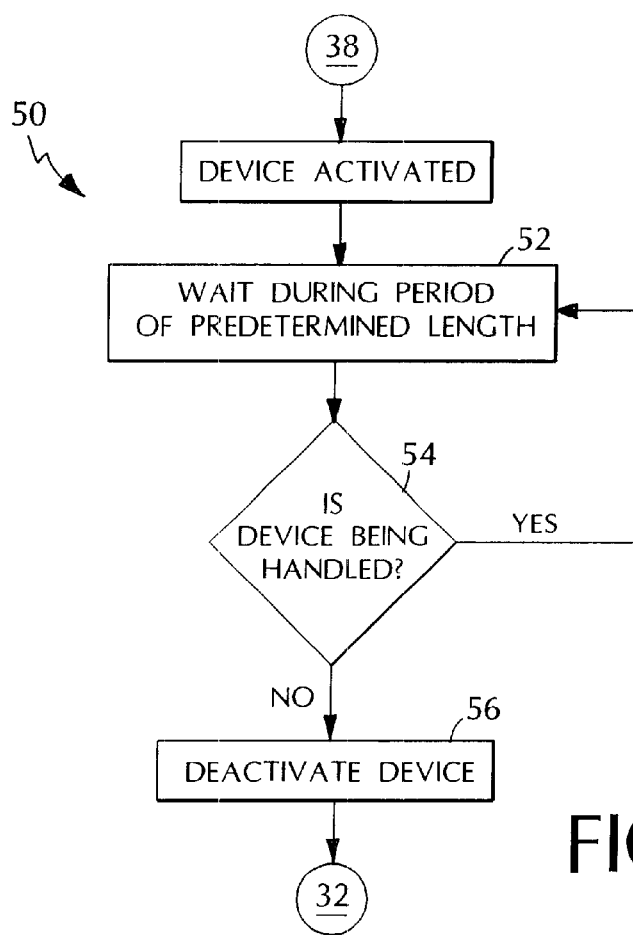
FIG. 4 is a flow chart for a method of deactivating a device.

FIG. 4 is a flow chart showing a method 50 for deactivating the device 10 when activated. The monitoring module 16 waits a predetermined time period after activating the device 10 (step 52). Then, the monitoring module 16 uses signals from the sensors 18–20 to determine whether the device 10 is still being handled (step 54). To determine whether the device 10 is being handled, the monitoring module 16 performs steps 34 and 36 of FIG. 3 for the various sensors 18–20. If the signal from one of the sensors 18–20 indicates that the device 10 is being handled, the monitoring module 16 determines that the device 10 is still being handled.

If the monitoring module 16 determines that the device 10 is not still being handled, the monitoring module 16 deactivates the device 10 (step 56). The monitoring module 16 stops the flow of power from the battery pack 14 to the function circuits 12 to deactivate the device 10. If the device 10 is still being handled, the monitoring module 16 returns to step 52. Thus, the monitoring module 16 deactivates the device 10 in response to an absence of handling during a time about equal to the delay period of step 52.

In various embodiments, the device 10 is capable of automatically activating in response to being handled and/or deactivating in response to not being handled for a predetermined time.

Other embodiments are within the scope of the following claims.

What is claimed is:

1. An apparatus comprising:
    a portable internet access device comprising a case;
    a first sensor and a second sensor positioned on the exterior of the case, each sensor comprising a conductive paint spot, said first sensor and said second sensor being configured to change capacitance in response to being held by a user; and
    a monitoring module within the case and coupled to control the internet access device, the monitoring module being configured to measure the capacitance of the first sensor and activate the internet access device in response to a change in the first sensor capacitance indicating the device is being held by a user and then to measure the capacitance of the second sensor and activate the internet access device if not otherwise activated, in response to a change in the second sensor capacitance indicating the device is being held by a user.

2. The apparatus of claim 1, wherein the monitoring module deactivates the internet access device in response to determining that the device is not being held by a user.

3. The apparatus of claim 1, wherein the monitoring module activates the internet access device in response to the device being picked up.

4. The apparatus of claim 3, wherein the monitoring module deactivates the internet access device in response to the device being put down.

5. An apparatus comprising:
    a portable internet access device comprising a case;
    a first sensor and a second sensor positioned on an exterior of the case, each sensor comprising a conductive paint spot, said first sensor and said second sensor being configured to change capacitance in response to being held by a user; and
    a monitoring module within the case and coupled to control the internet access device, said monitoring module being configured to measure the capacitance of the first sensor and activate internet access device in response to a change in the first sensor capacitance indicating the device is being picked up or held by a user and then to measure the capacitance of the second sensor and activate the internet access device in response to a change in the second sensor capacitance indicating the device is being held by a user, and deactivate the internet access device in response to a change in the sensor capacitance, indicating the device has been put down or is not being held by the user.

6. A method comprising:
    selecting a first sensor from a plurality of sensors disposed on the exterior of an internet access device, each sensor comprising a conductive paint spot;

receiving a signal from the first sensor, determining the capacitance of the first sensor based on the signal;

determining whether the internet access device is being held by a user based on the capacitance of the first sensor;

activating the portable internet access device if the device is being held by a user; and if the device is not being held by a user, selecting a second sensor from the plurality of sensors, receiving a second signal from the second sensor, determining the capacitance of the second sensor based on the second signal, determining whether the internet access device is being held by a user based on the capacitance of the second sensor, and activating the portable internet access device if the device is being held by a user.

7. The method of claim 6 further comprising deactivating the portable internet access device if it is not being held by a user.

* * * * *